United States Patent
Uetani et al.

(10) Patent No.: US 6,846,609 B2
(45) Date of Patent: Jan. 25, 2005

(54) CHEMICAL AMPLIFICATION TYPE POSITIVE RESIST COMPOSITION

(75) Inventors: Yasunori Uetani, Toyonaka (JP); Takakiyo Terakawa, Ibaraki (JP); Kaoru Araki, Kyoto (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/239,896

(22) PCT Filed: Mar. 21, 2001

(86) PCT No.: PCT/JP01/02246

§ 371 (c)(1),
(2), (4) Date: Sep. 26, 2002

(87) PCT Pub. No.: WO01/73512

PCT Pub. Date: Oct. 4, 2001

(65) Prior Publication Data

US 2003/0113661 A1 Jun. 19, 2003

(30) Foreign Application Priority Data

Mar. 28, 2000 (JP) .................................... 2000-0088788

(51) Int. Cl.⁷ ............................................... G03F 7/039
(52) U.S. Cl. .................... 430/270.1; 430/905; 430/910; 525/337
(58) Field of Search .............................. 430/270.1, 905, 430/910; 525/337

(56) References Cited

U.S. PATENT DOCUMENTS

| | | | |
|---|---|---|---|
| 5,851,727 A | 12/1998 | Choi et al. | |
| 6,239,231 B1 * | 5/2001 | Fujishima et al. | .......... 525/337 |
| 6,284,863 B1 * | 9/2001 | Ohta et al. | ................... 528/215 |
| 6,495,306 B2 * | 12/2002 | Uetani et al. | ............ 430/270.1 |
| 6,495,307 B2 * | 12/2002 | Uetani et al. | ............ 430/270.1 |
| 6,627,381 B1 * | 9/2003 | Uetani et al. | ............ 430/270.1 |

FOREIGN PATENT DOCUMENTS

| | | | |
|---|---|---|---|
| EP | 0 789 279 A1 | 8/1997 | |
| EP | 982628 A2 * | 3/2000 | ........... G03F/7/004 |
| JP | 08-101508 A | 4/1996 | |
| JP | 11-030865 A | 2/1999 | |
| JP | 11-109632 A | 4/1999 | |
| JP | 2000-227658 A | 8/2000 | |
| JP | 2001-066778 A | 3/2001 | |
| WO | WO01/73512 A1 | 4/2001 | |

OTHER PUBLICATIONS

Kamiya et al. JP 2000–227658 A, Machine Translation.*

* cited by examiner

Primary Examiner—Yvette C. Thornton
(74) Attorney, Agent, or Firm—Birch, Stewart, Kolasch & Birch, LLP

(57) ABSTRACT

A chemical amplification type positive resist composition is provided, comprising a resin which has at least one polymerization unit selected from a polymerization unit of 3-hydroxy-1-adamantyl acrylate and a polymerization unit of 3,5-dihydroxy-1-adamantyl (meth)acrylate, a polymerization unit of hydroxystyrene and a polymerization unit having a group uhstable to an acid, is itself insoluble or poorly soluble in an alkali but becomes alkali-soluble after said group unstable to an acid is dissociated by the action of an acid; and an acid generator, the composition being excellent in various abilities such as sensitivity, resolution, heat resistance, film retention ratio, applicability, exposure clearance, dry etching resistance and the like, particularly having further improved resolution and exposure clearance.

9 Claims, No Drawings

CHEMICAL AMPLIFICATION TYPE POSITIVE RESIST COMPOSITION

This application is the national phase under 35 U.S.C. §371 of PCT International Application No. PCT/JP01/02246 which has an International filing date of Mar. 21, 2001, which designated the United States of America.

TECHNICAL FIELD

The present invention relates to a resist composition suitable for lithography and the like acting by high energy radiation such as far ultraviolet ray (including excimer laser and the like), electron beam, X ray and emitting light.

BACKGROUND ART

Recently, by increased integration of integrated circuits, submicron pattern formation is required. Particularly, lithography using excimer laser from krypton fluoride (KrF) or argon fluoride (ArF) is paid to attention since it enables production of 64 M DRAM to 1 G DRAM. As the resist suitable for such excimer laser liphoraphy process, a so-called chemical amplification type resist utilizing an acid catalyst and a chemical amplification effect is being adopted. When a chemical amplification type resist is used, an acid generated from an acid generator at irradiated part is diffused in the subsequent heat treatment (post exposure bake: hereinafter, abbreviated as PEB in some cases), and the solubility of the irradiated part in an alkali developer is changed by a reaction using the resulted acid as a catalyst, thus, a positive or negative pattern is obtained.

For providing a chemical amplification type positive resist, particularly, a positive resist for KrF excimer laser lithography, a poly(hydroxystyrene)-based resin in which a part of phenolic hydroxyl groups is protected by a group dissociating by the action of an acid is often used in combination with an acid generator. As such a group dissociating by the action of an acid, those forming an acetal type bond with an oxygen atom derived from a phenolic hydroxyl group, for example, those having a structure in which tetrahydro-2-pyranyl, tetrahydro-2-furyl or 1-ethoxyethyl is bonded to an oxygen atom, are paid to attention, from the standpoints of resolution, sensitivity and the like. However, there is a limitation on resolution even if such a resin is used.

Further, in pattern formation by photolithography, in general, the finished size of a resist pattern tends to vary depending on variation of exposure amount, and exposure latitude (also called exposure margin) is small. Thus, in conventionally known resist compositions, resolution, sensitivity, exposure clearance and the like are limited. Further, for production of an integrated circuit, dry etching is conducted using a resist pattern formed by photolithography as a mask. Therefore, the resist used in this is required to have also heat resistance and dry etching resistance.

The object of the present invention is to provide a chemical amplification type positive resist composition excellent in various abilities such as sensitivity, resolution, heat resistance, film thickness after development at unexposed area, applicability, exposure clearance, dry etching resistance and the like, particularly, having further improved resolution and exposure clearance.

The present inventors have intensively studied for attaining such an object, and resultantly found that excellent abilities are obtained by using at least one hydroxystyrene-based copolymer selected from 3-hydroxy-1-adamantyl acrylate and 3,5-dihydroxy-1-adamantyl (meth)acrylate, as a resin component of a chemical amplification type positive resist, completing the present invention.

SUMMARY OF THE INVENTION

Namely, the present invention provides a chemical amplification type positive resist composition comprising a resin which has at least one polymerization unit selected from a polymerization unit of 3-hydroxy-1-adamantyl acrylate and a polymerization unit of 3,5-dihydroxy-1-adamantyl (meth)acrylate, a polymerization unit of hydroxystyrene, and a polymerization unit having a group unstable to an acid, and is itself insoluble or poorly soluble in an alkali but becomes alkali-soluble after the above-mentioned group unstable to an acid is dissociated by the action of an acid; and an acid generator.

The resin component which is a main component in the resist composition of the present invention is itself insoluble or poorly soluble in an alkali but becomes alkali-soluble by causing a chemical change by the action of an acid, and has essentially at least two polymerization units; a polymerization unit of hydroxystyrene and at least one polymerization unit selected from a polymerization unit of 3-hydroxy-1-adamantyl acrylate and a polymerization unit of 3,5-dihydroxy-1-adamantyl (meth)acrylate. These polymerization units are formed by opening of a double bond at a styrene part and a double bond at a (meth)acrylic acid part, and can be represented by the following formulae (I) and (IIa) to (IIc), respectively

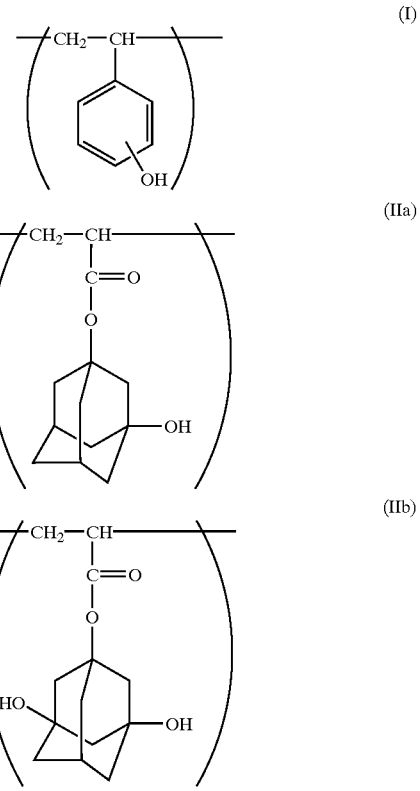

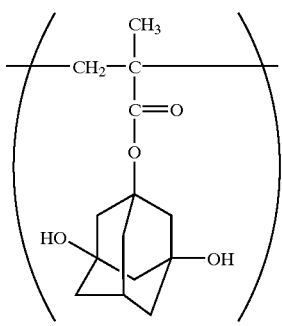
(IIc)

In a hydroxystyrene unit of the formula (I), a positional relation between a hydroxyl group and a vinyl group is not particularly restricted, however, p-hydroxystyrene is generally used.

Though this resin is itself insoluble or poorly soluble in an alkali, it has a polymerization unit having a group unstable to an acid to become alkali-soluble by causing a chemical change by the action of an acid. The group unstable to an acid is usually introduced in a resin, in the form of protection of an alkali-soluble group such as a hydroxyl group, carboxyl group and the like. As such a group unstable to an acid for protecting an alkali-soluble group, specifically exemplified are tert-butyl, tert-butoxycarbonyl, acetal-based groups of the following formula (III)

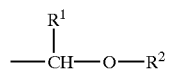
(III)

(wherein $R^1$ represents an alkyl having 1 to 4 carbon atoms, $R^2$ represents an alkyl having 1 to 6 carbon atoms or a cycloalkyl having 5 to 7 carbon atoms, or $R^1$ and $R^2$ together form a trimethylene chain or a tetramethylene chain), 2-alkyl-2-adamantyl of the following formula (IV)

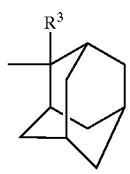
(IV)

(wherein, $R^3$ represents an alkyl having 1 to 4 carbon atoms), and the like. These groups shall be substituted for hydrogen on a hydroxyl group or hydrogen on a carboxyl group.

Examples of the acetal-based group of the formula (III) suitably include tetrahydro-2-furyl, tetrahydro-2-pyranyl, 1-ethoxyethyl, 1-isopropoxyethyl, 1-isobutoxyethyl, 1-ethoxypropyl, 1-ethoxy-2-methylpropyl, 1-cyclohexyloxyethyl and the like, and of them, 1-ethoxyethyl, 1-isobutoxyethyl, 1-isopropoxyethyl, 1-ethoxypropyl and the like are preferable. Examples of the 2-alkyl-2-adamantyl of the formula (IV) include 2-methyl-2-adamantyl, 2-ethyl-2-adamantyl and the like.

In the above-mentioned groups unstable to an acid, tert-butoxycarbonyl is usually substituted on a hydroxyl group, and 2-alkyl-2-adamantyl of the formula (IV) is usually substituted on a carboxyl group. Other tert-butyl and acetal-based groups of the formula (III) can be substituted on any of a hydroxyl group and a carboxyl group.

The resist for KrF excimer laser exposure is generally in the form in which a group unstable to an acid protects a hydroxyl group in a hydroxystyrene unit, as describe above. Then, such a unit in which an acid-unstable group is bonded to a hydroxyl group in a hydroxystyrene unit can be represented by the following formula (V).

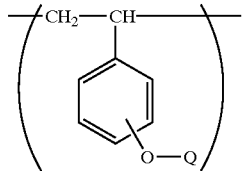
(V)

In the formula. Q represents a group unstable to an acid. As Q in this formula, specifically listed are tert-butyl, tert-butoxycarbonyl, acetal-based groups of the above-mentioned formula (III), and the like of them, acetal-based groups of the above-mentioned formula (III) are preferable. In this preferable embodiment, the polymerization unit can be represented by the following formula (VI).

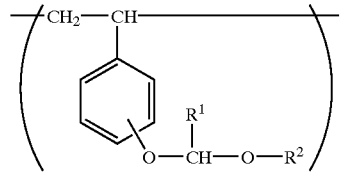
(VI)

In the formula, $R^1$ and $R^2$ are as defined previously in the formula (III). Of them, preferably, $R^1$ represents an alkyl having 1 to 4 carbon atoms and $R^2$ represent an alkyl having 1 to 6 carbon atoms or a cycloalkyl having 5 to 7 carbon atoms, in the formula (III) or (VI).

The resin which has at least one polymerization unit selected from a polymerization unit of 3-hydroxy-1-adamantyl acrylate and a polymerization unit of 3,5-dihydroxy-1-adamantyl (meth)acrylate, a polymerization unit of hydroxystyrene and a polymerization unit having a group unstable to an acid as described above can be produced as described below, for example. First, when the group unstable to an acid is tert-butyl and it is substituted on a hydroxyl group in hydroxystyrene, tert-butoxystyrene and at least one selected from 3-hydroxy-1-adamantyl acrylate and 3,5-dihydroxy-1-adamantyl (meth)acrylate are copolymerized according to an ordinary method, then, hydrolyzed appropriately to substitute a part of tert-butoxy groups by a hydroxyl group, thus, the above-mentioned cab be produced. Further, when the group unstable to an acid is tert-butoxycarbonyl and it is substituted on a hydroxyl group in hydroxystyrene, a copolymer of hydroxystyrene and at least one selected from 3-hydroxy-1-adamantyl acrylate and 3,5-dihydroxy-1-adamantyl (meth)acrylate is reacted with di-tert-butyl dicarbonate, thus, the above-mentioned cab be produced.

Next, when the group unstable to an acid is an acetal-based group of the above-mentioned formula (III) and it is substituted on a hydroxyl group in hydroxystyrene, a copolymer of hydroxystyrene and at least one selected from 3-hydroxy-1-adamantyl acrylate and 3,5-dihydroxy-1-adamantyl (meth)acrylate is reacted with an unsaturated ether compound of the following formula (IIIa)

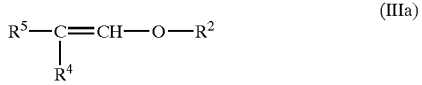

(IIIa)

(wherein, $R^2$ is as defined previously, $R^4$ and $R^5$ represent, mutually independently, hydrogen or alkyl, and the total carbon number of them is 0 to 3 or, $R^5$ represents hydrogen, and $R^2$ and $R^4$ together form a trimethylene chain or tetramethylene chain), thus, the above-mentioned cab be produced.

On the other hand, when the group unstable to an acid is tert-butyl, acetal-based group of the formula (III), 2-alkyl-2-adamantyl of the formula (IV) or the like and it is substituted on a carboxyl group, usually, an unsaturated compound in which such a group forms a carboxylate is copolymerized with hydroxystyrene and at least one selected from 3-hydroxy-1-adamantyl acrylate and 3,5-dihydroxy-1-adamantyl (meth)acrylate, thus, the above-mentioned cab be produced. As the unsaturated compound in which a group unstable to an acid forms a carboxylate, listed are unsaturated aliphatic carboxylates such as acrylates and methacrylates, unsaturated alicyclic carboxylates such as norbornenecarboxylate, tricyclodecenecarboxylate, tetracyclodecenecarboxylate, and the like.

Copolymerization using hydroxystyrene or tert-butoxystyrene, and at least one selected from 3-hydroxy-1-adamantyl acrylate and 3,5-dihydroxy-1-adamantyl (meth)acrylate, and in some cases, further, monomers having a group unstable to an acid and/or other monomers, can be conducted according to an ordinary method. For example, raw material monomers are dissolved in a suitable solvent, to this is added a polymerization initiator to initiate polymerization, and the reaction is allowed to continue under heat or heat removal. As the reaction solvent, alcohols such as methanol, ethanol, 2-propanol and tert-butanol, aromatic hydrocarbons such as benzene, toluene and xylene, ethers such as tetrahydrofuran, 1,4-dioxane and the like can be used. As the polymerization initiator, azo compounds such as 2,2'-azobis(isobutyronitrile) and dimethyl 2,2'-azobis(2-methyl propionate), peroxides such as benzoyl peroxide and tert-butyl peroxide, redox-based initiators such as hydrogen peroxide/ferrous salt and benzoyl peroxide/dimethylaniline, metal alkylated compounds such as butyllithium and triethylaluminum, and the like can be used.

When tert-butoxystyrene is used as a raw material monomer, a copolymer is dissolved in a hydrophilic solvent, and heated under acidity, to hydrolyze a tert-butoxy group in the copolymer, obtaining a copolymer comprising at least one selected from hydroxystyrene/3-hydroxy-1-adamantyl acrylate and 3,5-dihydroxy-1-adamantyl (meth)acrylate. Further, when a group unstable to an acid is introduced in a copolymer comprising at least one selected from hydroxystyrene/3-hydroxy-1-adamantyl acrylate and 3,5-dihydroxy-1-adamantyl (meth)acrylate, an operation according to a usual protective group-introducing reaction may advantageously be conducted. For example, when an acetal-based group of the above-mentioned formula (III) is introduced, a raw material copolymer is dissolved in a solvent, and an unsaturated ether compound of the above-mentioned formula (IIIa) is reacted in the presence of an acid catalyst, a part of hydroxyl groups in the copolymer can be changed to an acetal-based group of the above-mentioned formula (III). As the acid catalyst in this reaction, inorganic acids such as hydrochloric acid and sulfuric acid, organic acids such as p-toluenesulfonic acid and camphorsulfonic acid, and the like are used.

The resin component constituting the positive resist composition of the present invention essentially has, as described above, a polymerization unit of hydroxystyrene, at least one polymerization unit selected from a polymerization unit of 3-hydroxy-1-adamantyl acrylate and a polymerization unit of 3,5-dihydroxy-1-adamantyl (meth)acrylate, and a polymerization unit having a group unstable to an acid. However, this resin component may also contain various polymerization units such as styrene, acrylonitrile, methyl methacrylate, methyl acrylate and the like. Further, for improving transparency, it may be partially hydrogenated, or an alkyl group or alkoxy group and the like may be introduced in a phenol nucleus. However, it is advantageous that the total amount of a polymerization unit of hydroxystyrene and at least one polymerization unit selected from a polymerization unit of 3-hydroxy-1-adamantyl acrylate and a polymerization unit of 3,5-dihydroxy-1-adamantyl (meth)acrylate is 50 mol % or more of the whole resin. The ratio of both polymerization units is usually in the range from 99:1 to 80:20, preferably in the range from 95:5 to 85:15, in terms of molar ratio of hydroxystyrene unit: at least one polymerization unit selected from a polymerization unit of 3-hydroxy-1-adamantyl acrylate and a polymerization unit of 3,5-dihydroxy-1-adamantyl (meth)acrylate. The amount of a polymerization unit having a group unstable to an acid is usually 50 mol % or less, preferably 10 mol % or more and 45 mol % or less.

When a copolymer of hydroxystyrene/at least one selected from 3-hydroxy-1-adamantyl acrylate and 3,5-dihydroxy-1-adamantyl (meth)acrylate is reacted with a compound for introducing an acid-unstable group, for example, di-tert-butyl dicarbonate or an unsaturated ether compound of the above-mentioned formula (IIIa), a protective group can be introduced also on a hydroxyl group in at least one selected from 3-hydroxy-1-adamantyl acrylate and 3,5-dihydroxy-1-adamantyl (meth)acrylate, together with a hydroxyl group in a hydroxystyrene unit. In the case of presence of such a group in which a hydroxyl group in at least one selected from 3-hydroxy-1-adamantyl acrylate and 3,5-dihydroxy-1-adamantyl (meth)acrylate is protected with a group unstable to an acid, it is reasonable to think that this unit is included in polymerization units having a group unstable to an acid.

Next, the acid generator which is another component in the positive resist composition is a substance which is decomposed to generate an acid, by allowing radiation such as light, electron beam and the like to act on the substance itself or a resist composition containing the substance. An acid generated from an acid generator acts on the above-mentioned resin, to dissociate a group unstable to an acid present in the resin. Examples of such an acid generator include onium salt compounds, s-triazine-based organic halogen compounds, sulfone compounds, sulfonate compounds and the like. Specifically, the following compounds are listed.

Diphenyliodonium trifluoromethanesulfonate
4-methoxyphenylphenyliodonium hexafluoroantimonate,
4-methoxyphenylphenyliodonium trifluoroantimonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
tripheylsulfonium hexafluorophosphate,
trlpheylsulfonium hexafluoroantimonate,
tripheylsulfonium trifluoromethanesulfonate,
4-methylphenyldiphenylsulfonium perfluorobutanesulfonate, 4-methylphenyldiphenylsulfonium perfluorooctanesulfonate, 4-methoxyphenyldiphenylsulfonium hexafluoroantimonate, 4-methoxyphenyldiphenylsulfonium trifluoromethanesulfonate, p-tolyldiphenylsulfonium trifluoromethanesulfonate, 2,4,6-trimethylphenyldiphenylsulfonium trifluoromethanesulfonate, 4-tert-butylphenyldiphenylsulfonium trifluoromethanesulfonate, 4-phenylthiophenyldiphenylsulfonium hexafluorophosphate, 4-phenylthiophenyldiphenylsulfonium hexafluoroantimonate, 1-(2-naphthoylmethyl)thioranium hexafluoroantimonate, 1-(2-naphthoylmethyl)thioranium trifluoromethanesulfonate, 4-hydroxy-1-naphthyldimethylsulfonium hexafluoroantimonate, 4-hydroxy-1-naphthyldimethylsulfonium trifluoromethanesulfonate, 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxolan-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, 2-(4-pentyloxystyryl)-4,6-bis(trichloromethyl)-1,3,5-triazine, 1-benzoyl-1-phenylmethyl p-toluenesulfonate (trivial name: benzoin tosylate), 2-benzoyl-2-hydroxy-2-phenylethyl p-tolueaesulfonate (trivial name: α-methylolbenzoin tosylate), 1,2,3-benzenetoluyl trismethanesulfonate, 2,6-dinitrobenzyl p-toluenesulfonate, 2-nitrobenzyl p-toluenesulfonate, 4-nitrobenzyl p-toluenesulfonate, diphenyl disulfone, di-p-tolyl disulfone.

bis(phenylsulfonyl)diazomethane, bis(4-chlorophenylsulfonyl)diazomethane, bis(p-tolylsulfonyl)diazomethane, bis (4-tert-butylphenylsulfonyl) diazomethane, bis(2,4-xylylsulfonyl)diazomethane, bis(cyclohexylsulfonyl)diazomethane, (benzoyl)(phenylsufonyl)diazomethane, N-(phenylsulfonyloxy)succinimide, N-(trifluoromethylsulfonyloxy)succinimide, N-(trifluoromethylsulfonyloxy)phthalimide, N-(trifluoromethylsulfonyloxy)-5-norbornene-2,3-dicarboxyimide, N-(trifluoromethylsulfonyloxy)naphthalimide, N-(10-camphorsulfonyloxy)naphthalimide and the like.

It is generally known that, in a chemical amplification type positive resist, by adding an organic base compound as a quencher, deterioration in abilities due to deactivation of an acid by being left after exposure can be improved, and also in the present invention, it is preferable to compound an organic base compound, particularly, a nitrogen-containing basic organic compound as a quencher. Specific examples of such a nitrogen-containing basic organic compound include amines of the following formulae.

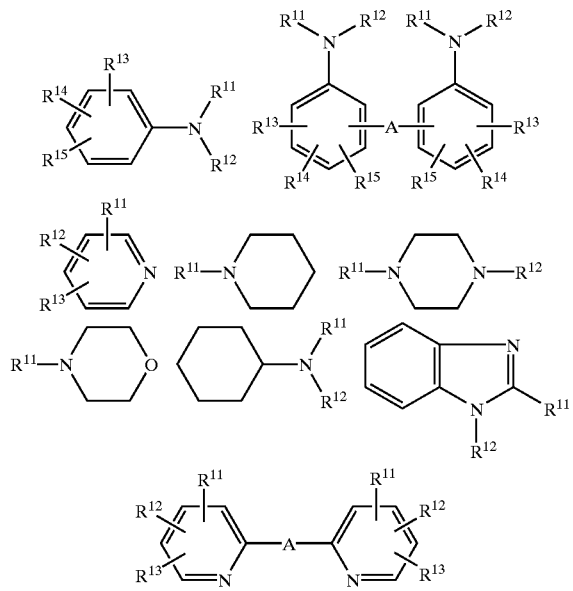

In the formulae, $R^{11}$, $R^{12}$, $R^{13}$, $R^{14}$ and $R^{15}$ represent each independently hydrogen, an alkyl, cycloalkyl, aryl or alkoxy optionally substituted by a hydroxyl group, and A represent an alkylene, carbonyl or imino. Here, the alkyl and alkoxy represented by $R^{11}$, to $R^{15}$ can have about 1 to 6 carbon atoms, and the cycloalkyl can have about 5 to 10 carbon atoms, and the aryl can have about 6 to 10 carbon atoms. The alkylene represented by A can have about 1 to 6 carbon atoms, and may be linear or branched. Further, a hindered amine compound having a hindered piperidine skeleton disclosed in JP-A No. 9-208864, which is a prior application of the applicant, can be used as a quencher.

The resist composition of the present invention preferably contains a resin component in an amount of 80 to 99.8% by weight and an acid generator in an amount of 0.1 to 20% by weight based on the total solid content. When a nitrogen-containing basic organic compound as a quencher is contained, it is preferably used in an amount of 10% by weight or less based on the total solid content in the resist composition. This composition can also contain a small amount various additives such as a sensitizer, dissolution inhibitor, other resin, surfactant, stabilizer, dye and the like, if necessary.

The resist composition is usually used in the form of a resist solution containing the above-mentioned components dissolved in a solvent, and applied on a substrate such as a silicon wafer and the like according to an ordinary method such as spin coating and the like. The solvent herein used may be one dissolving components, showing a suitable drying speed, and giving a uniform and smooth coated film after evaporation of a solvent, and can be one usually used in this field. Examples thereof include glycol ether esters such as ethylcellosolve acetate, methylcellosolve acetate and propylene glycol monomethyl ether acetate, esters such as ethyl lactate, butyl acetate, amyl acetate and ethyl pyruvate, ketones such as acetone, methyl isobutyl ketone, 2-heptanone and cyclohexanone, cyclic esters such as γ-butyrolactone, alcohols such as 3-methoxy-1-butanol, and the like. These solvents can be used each alone or in combination of two or more.

On a resist film applied on a substrate and dried, exposure treatment for patterning is performed, then, heating treatment for accelerating de-protection group reaction (FEB) was conducted. Then, the film is developed with an alkali developer. The alkali developer here used can include various alkaline aqueous solutions used in this field, and generally, aqueous solutions of tetramethylammonium hydroxide and (2-hydroxyethyl)trimethylammonium hydroxide (usually called: choline) are often used.

The present invention will be specifically illustrated by examples below, but the scope of the present invention is not limited to these examples at all. In the examples, % and parts representing the content or use amount are by weight unless otherwise stated. The weight-average molecular weight (Mw) and polydispersion (Mw/Mn) were measured by gel permeation chromatography using polystyrene as a standard.

SYNTHESIS EXAMPLE 1

Production of Partial 1-ethoxyethylated Compound of Hydroxystyrene/3-hydroxy-1-adamantyl Acrylate Copolymer (1) Production of hydroxystyrene/3-hydroxy-1-adamantyl Acrylate Copolymer Into a flask was charged 92.8 g (0.53 mol) of 4-tert-butoxystyrene, 13.0 g (0.06 mol) of 3 hydroxy-1-adamantyl acrylate, 52.9 g of methanol and 105.8 g of 2-propanol, and they were refluxed under a nitrogen atmosphere at 75° C. Separately, 6.1 g of dimethyl 2,2'-azobis(2-methylpropionate) was dissolved in 17.6 g of 2-propanol to prepare a solution which was dropped into the above-mentioned monomer solution kept at 75° C. over 30 minutes, then, the resulted mixture was refluxed itself for 8 hours. To this was further added 193.9 g of 2-propanol, and the resulted mixture was refluxed again at 75° C. Into this solution was dropped a mixed solution of 18.3 g of 36% hydrochloric acid and 18.3 g of 2-propanol. Subsequently, the mixture was refluxed for 4 hours at the same temperature to cause hydrolysis, then, the solution was cooled to room temperature. To this reaction mass was added 528.9 g of n-heptane, and the lower resin layer was removed. This resin layer was dissolved in 52.9 g of acetone, and 528.9 g of n-heptane was added, and the lower resin layer was removed again. The resulted resin layer was dissolved in 634.7 g of methyl isobutyl ketone, and 211.6 g of ion exchanged water was added to this and the mixture was stirred and allowed to stand still, then, the organic layer part was removed. Further, an operation of addition of 211.6 g of ion exchanged water, stirring and separation was repeated four times. This organic layer was distilled under reduced pressure until the solution amount after distillation was 230.8 g under conditions of a temperature of 60° C. and a pressure of 80 Torr or less, and dehydrated azeotropically, to obtain a methyl isobutyl ketone solution of a copolymer of 4-hydroxystyrene and 3-hydroxy-1-adamantyl acrylate. The solid concentration of the resulted resin solution was 26.3%, and this copolymer had a weight-average molecular weight of 11400 and a polydispersity of 1.77.

(2) Partial 1-ethoxyethylation of hydroxystyrene/3-hydroxy-1-adamantyl Acrylate copolymer Into a nitrogen-purged flask was charged 115.4 g (resin content: 30.4 g) of the methyl isobutyl ketone solution of a copolymer of 4-hydroxystyrene and 3-hydroxy-1-adamantyl acrylate obtained in the above-mentioned process (1) and 97.1 g of methyl isobutyl ketone, and they were dissolved. To this 4 as added 4 mg (0.02 mmol) of p-toluenesulfonic acid monohydrate, then, 8.68 g (0.12 mol) of ethyl vinyl ether was dropped, further, they were reacted for 3 hours at 25° C. To this reaction solution was added 60 ml of ion exchanged water and the mixture was stirred and allowed to stand still, then, the organic layer part was removed. Further, an operation of addition of 60 ml of ion exchanged water, stirring and separation was repeated four times. The solvent was distilled off from this organic layer for concentration, then, propylene glycol monomethyl acetate was added and the solvent was further distilled off, to cause solvent substitution. The resulted resin solution had a solid concentration of 27.6%, and this resin was analyzed by $^1$H-NMR to observe clearly a peak corresponding to a 1-ethoxyethoxy group, and the ratio of the number of a 1-ethoxyethoxy group to the number of a benzene ring was 38.0%. Therefore, this resin is a substance in which hydroxyl groups in a copolymer of 4-hydroxystyrene and 3-hydroxy-1-adamantyl acrylate are partially 1-ethoxy ethyl etherified. This resin is called resin A.

SYNTHESIS EXAMPLE 2

Production of Another Partial 1-ethoxyethylated Compound of hydroxystyrene/3-hydroxy-1-adamantyl Acrylate Copolymer The procedure in the process (2) in Synthesis Example 1 was repeated except that the charging amount of ethyl vinyl ether was 5.45 g (0.08 mol). The resulted resin solution had a solid concentration of 25.9%, and this resin was analyzed by $^1$H-NMR to find that the ratio of the number of a 1-ethoxyethoxy group to the number of a benzene ring was 20.5%. This resin is called resin B.

SYNTHESIS EXAMPLE 3

Production of Partial 1-ethoxyethylated Compound of Polyhydroxystyrene

Into a 1 liter eggplant form flask was charged 40 g of poly(p-hydroxystyrene) (tradename: "VP-15000") manufactured by Nippon Soda Co., Ltd. (333 mmol as p-hydroxystyrene unit) and 47 mg (0.25 mmol) of p-toluenesulfonic acid monohydrate, and these were dissolved in 720 g of propylene glycol monomethyl ether acetate. This solution was distilled under reduced pressure under conditions of a temperature of 60° C. and a pressure of 10 Torr or less, to cause azeotropic dehydration. The solution after distillation had a weight of 337 g. This solution was moved into a nitrogen-purged 500 ml four-necked flask, and into this was added 12.0 g (166 mmol) of ethyl vinyl ether dropwise, then, they were reacted at 25° C. for 5 hours. To this reaction solution was added 62.3 g of propylene glycol monomethyl ether acetate and 320 g of methyl isobutyl ketone, further, 240 ml of ion exchanged water was added to this, and the mixture was stirred. Then, the mixture was allowed to stand still, and the organic layer part was removed. To this organic layer was added again 240 ml of ion exchanged water, and the mixture was stirred and allowed the stand still, and separated, to perform washing. Washing with ion exchanged water and separation were repeated once more, then, the organic layer was removed and distilled under reduced pressure, to remove water and methyl isobutyl ketone by azeotrope with propylene glycol monomethyl ether acetate, to give a propylene glycol monomethyl other acetate solution. The resulted liquid is a solution of a resin in which hydroxyl groups in poly(p-hydroxystyrene) are partially 1-ethoxy ethyl etherified. This resin was analyzed by $^1$H-NMR to find that 40% of hydroxyl groups had been 1-ethoxy ethyl etherified. This resin is called resin C.

EXAMPLES 1, 2 AND COMPARATIVE EXAMPLE 1

In Example 1, the resin A is used, in Example 2, the resin A and the resin B were mixed at a solid content ratio of 1:1 before use, and in Comparative Example 1, the resin C was used. These resins were dissolved in admixture with an acid generator, quencher and solvent at the following formulation, further, filtrated through a fluorine resin filter having a pore diameter of 0.2 μm, to prepare resist solutions.

| | |
|---|---|
| Resin (solid content) | 10 parts |
| Acid generator: (bis(cyclohexylsulfonyl)diazomethane ["DAM-301" manufactured by Midori Kagaku K.K.]) | 0.4 parts |
| Quencher: dicyclohexylmethylamine | 0.015 parts |
| Solvent: (propylene glycol monomethyl ether acetate) | 50 parts * |

* solvent amount includes which introduced from resin solution

On a silicon wafer, the above-mentioned resin solution was spin-coated, then, pre-baked on a direct hot plate under conditions of 90° C. and 60 seconds, to form a resist film having a thickness of 0.72 μm. The wafer on which a resist film was thus formed was exposed through masks having various forms and dimensions using KrF excimer stepper ["NSR 2205EX12B" manufactured by Nikon Corp., NA=0.55]. Then, PEB was conducted under conditions of 100° C. and 60 seconds on a hot plate, further, puddle development was conducted with a 2.38% tetramethylammonium hydroxide aqueous solution. The pattern after development was observed by a scanning electron microscope, and sensitivity, exposure clearance and resolution were measured as described below, and the results are shown in Table 1.

Dose to clear sensitivity: It is represented by the minimum exposure amount necessary to just clear the resist film in 1 mm square open field. This is called Eth.

Effective sensitivity(Dose to size): It is represented by the exposure amount at which 0.25 μm line and space pattern is 1:1. This is called $E_0$.

Exposure latitude: It is represented by the value of $E_0$/Eth. When this value is larger, the range from the exposure amount to clear resist film to the standard exposure amount (dose to size) is wider, and resist clearance error does not occur easily, and even if the exposure amount is somewhat irregular, approximately constant pattern dimension is imparted. Consequently, the exposure latitude is better.

Resolution: It is represented by the minimum dimension of line and space pattern separating at the exposure amount at the effective sensitivity.

TABLE 1

| Example No. | Resin | Sensitivity (mJ/cm²) Eth | $E_0$ | Exposure clearance $E_0$/Eth | Resolution (μm) |
|---|---|---|---|---|---|
| Example 1 | A | 16 | 50 | 3.0 | 0.16 |
| Example 2 | A/B = 1/1 (weight ratio) | 16 | 34 | 2.1 | 0.18 |
| Comparative Example | C | 15 | 29 | 1.9 | 0.22 |

A resist composition prepared by using a resin having at least polymerization unit selected from hydroxystyrene/3-hydroxy-1-adamantyl acrylate and 3,5-dihydroxy-1-adamantyl (meth)acrylate according to the present invention has improved exposure clearance and resolution. Further, various abilities such as sensitivity, heat resistance, film retention ratio, applicability, dry etching resistance and the like can also be maintained at excellent levels. Therefore, by using of this composition, a fine resist pattern can be formed precisely.

What is claimed is:

1. A chemical amplification type positive resist composition comprising a resin which has, at least one polymerization unit selected from a polymerization unit of 3-hydroxy-1-adamantyl acrylate and a polymerization unit of 3,5-dihydroxy-1-adamantyl (meth)acrylate, a polymerization unit of hydroxystyrene, and a polymerization unit having a group unstable to an acid, and is itself insoluble or poorly soluble in an alkali but becomes alkali-soluble after the above-mentioned group unstable to an acid is dissociated by the action of an acid: and an acid generator.

2. The composition according to claim 1 wherein the polymerization unit having a group unstable to an acid is represented by the formula (V)

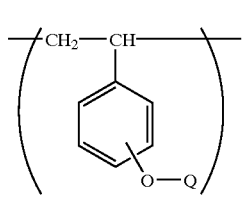

(V)

wherein, Q represents a group unstable to an acid.

3. The composition according to claim 2 wherein the group Q unstable to an acid is tert-butyl, tert-butoxycarbonyl or a group of the formula (III)

(III)

wherein, $R^1$ represents an alkyl having 1 to 4 carbon atoms, $R^2$ represents an alkyl having 1 to 6 carbon atoms or a cycloalkyl having 5 to 7 carbon atoms, or $R^1$ and $R^2$ together form a trimethylene chain or a tetramethylene chain.

4. The composition according to claim 3 wherein the group Q unstable to an acid is represented by the formula (III) in which $R^1$ represents an alkyl having 1 to 4 carbon atoms and $R^2$ represents an alkyl having 1 to 6 carbon atoms or a cycloalkyl having 5 to 7 carbon atoms.

5. The composition according claim 1 wherein the total amount of at least one polymerization unit selected from a polymerization unit of 3-hydroxy-1-adamantyl acrylate and a polymerization unit of 3,5-dihydroxy-1-adamantyl (meth) acrylate and a polymerization unit of hydroxystyrene is 50% or more based on the whole resin.

6. The composition according to claim 1 wherein at least one polymerization unit selected from a polymerization unit of 3-hydroxy-1-adamantyl acrylate and a polymerization unit of 3,5-dihydroxy-1-adamantyl (meth)acrylate and a polymerization unit of hydroxystyrene are present at a molar ratio of 1:99 to 20:80.

7. The composition according to claim 1 wherein the composition contains 80 to 99.8% by weight of the resin and 0.1 to 20% by weight of the acid generator based on the total solid content in the composition.

8. The composition according to claim 1 which further contains a nitrogen-containing basic organic compound as a quencher.

9. The composition according to claim 1 wherein the resin is obtained by copolymerizing a compound of the formula (VII), hydroxystyrene and at least one compound selected from the group consisting of 3-hydroxy-1-adamantyl acrylate and 3,5-dihydroxy-1-adamantyl (meth) acrylate

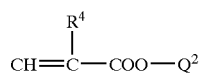
(VII)

wherein $Q^2$ in formula (VII) represents tert-butyl, group of the formula (III) or a group of the formula (IV),

(III)

wherein $R^1$ in formula (III) represents an alkyl having 1 to 4 carbon atoms, $R^2$ in formula (III) re resent an alkyl havin 1 to 6 carbon atoms or a cycloalkyl havin 5 to 7 carbon atoms, or $R^1$ and $R^2$ to ether form a trimethylene chain or a tetramethylene chain,

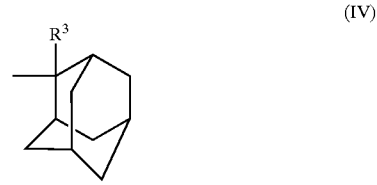
(IV)

wherein $R^3$ in formula (IV) represents an alkyl having 1 to 4 carbon atoms; and $R^4$ in formula (VII) represents a hydrogen or methyl.

* * * * *